(12) United States Patent
Arriens et al.

(10) Patent No.: US 7,479,802 B2
(45) Date of Patent: Jan. 20, 2009

(54) PROGRAMMABLE LOGIC INTEGRATED CIRCUIT FOR DIGITAL ALGORITHMIC FUNCTIONS

(75) Inventors: Dean J. Arriens, Tijeras, NM (US); Paul Short, Albuquerque, NM (US)

(73) Assignee: Quadric, Inc, Albuquerque, NM (US)

( * ) Notice: Subject to any disclaimer, the term of this patent is extended or adjusted under 35 U.S.C. 154(b) by 0 days.

(21) Appl. No.: 12/004,767

(22) Filed: Dec. 22, 2007

(65) Prior Publication Data

US 2008/0218203 A1 Sep. 11, 2008

Related U.S. Application Data

(60) Provisional application No. 60/905,947, filed on Mar. 9, 2007.

(51) Int. Cl.
*H03K 19/173* (2006.01)

(52) U.S. Cl. .......................... 326/38; 326/47; 708/232
(58) Field of Classification Search ............. 326/37–41, 326/47
See application file for complete search history.

(56) References Cited

U.S. PATENT DOCUMENTS 7,043,511 B1 *  5/2006  Dante ........................ 708/230
7,268,581 B1 *  9/2007  Trimberger et al. ........... 326/38
7,385,418 B2 *  6/2008  Speers et al. .................. 326/39

* cited by examiner

*Primary Examiner*—James H Cho
(74) *Attorney, Agent, or Firm*—Donald J. Lenkszus

(57) ABSTRACT

A programmable integrated circuit for calculating a digital algorithm is disclosed. The integrated circuit is programmable to operate on input data in accordance with one or more predetermined digital algorithms.

31 Claims, 18 Drawing Sheets

PROGRAMMABLE LOGIC INTEGRATED CIRCUIT FOR DIGITAL ALGORITHMIC FUNCTIONS

RELATED APPLICATIONS

This application claims priority from and the benefit of Provisional Application for Patent Ser. No. 60/905,947 filed Mar. 9, 2007.

FIELD OF THE INVENTION

The invention pertains to software programmable system architecture, in general, and to software programmable integrated circuit system architecture that can be programmed to provide algorithmic digital functions, in particular.

BACKGROUND OF THE INVENTION

Algorithm based digital functions in electronic systems are typically implemented in one of two ways: with an integrated circuit micro-processor or a custom integrated circuit including application specific integrated circuits ASICs and field programmable gate arrays FPGAs. Each has its advantages and disadvantages and the selection of which to use is an important consideration. The electronic system designer must balance many factors including performance, power, availability of talent, time to market, design cost, and production cost.

Computable functions can be implemented within a microprocessor and thus a microprocessor provides a general purpose platform to compute any function without changing hardware. A processor efficiently multiplexes diverse software functionality into a single hardware implementation by decomposing functionality into discrete instructions and providing hardware to compute each of these instructions. As instruction computation occurs, it utilizes the available computation hardware. Instructions not currently being computed are stored in memory—a very efficient physical implementation structure. In this way, software running on a processor performs the functionality achieved through custom hardware. Although this is similar to the reprogramming capability of an FPGA, the processor, relying on the storage of inactive instructions, achieves hardware reuse in real time with a very limited instruction set. Thereby, for certain functionality, a processor can achieve an efficient implementation over broad functionality.

In addition to functional efficiency, a processor enables a designer to implement at a higher level of abstraction. Unlike an ASIC or FPGA, there is no need to manage timing convergence or placement of functions on the silicon. This allows a user to produce a device that computes a digital algorithm or function using a higher level of abstraction. By designing at a higher level of abstraction, a software design project often requires many fewer staffing and development resources than an ASIC or FPGA.

Because it is architected to address broad functionality, a processor has limitations in its performance, especially when computing functions which have strict throughput constraints. A processor design must have the entire system performance accelerated to improve performance in specific areas of functionality.

Some integrated circuit processor implementations contain dedicated hardware functionality to overcome these performance issues and provide a fixed degree of concurrency. Some are focused on specific types of algorithms or functionalities, such as Digital Signal Processing or telecommunications processing. However, these customizations make the processor less general, reducing its applicability to certain other functions.

Current integrated circuit processors do not provide a customization path to address general sequential and concurrent computational bottlenecks of control and data after implementation of the processor, i.e., there is no mechanism to incorporate the hardware capability of ASIC or FPGA designs.

Custom integrated circuits ICs are the other major way in which digital algorithms or functions may be implemented in electronic systems.

ASIC and FPGA technologies currently used to implement custom digital IC hardware require designers to utilize a low-level set of computational and interconnect elements to represent the desired functionality. Because of the complexity of the design elements, both technologies require a very detailed analysis of timing delays associated with the computational and interconnect elements to verify the correct functionality of the design. In addition, the designer must manage all the placement of the functions on the physical silicon.

With ASIC technology, an ASIC supplier provides a designer with a library of pre-configured, standard logic cells with which the customer defines functionality. The customer also defines interconnects. ASIC suppliers build wafers of ICs with customer defined logic and interconnect. ASICs, once built, are permanently fixed in configuration and functionality. Logic and interconnects cannot change.

ASIC technology has high performance and low recurring cost, but can cost tens of millions of dollars to design and produce at 180 nm and below. The technology is hard-wired, meaning that it cannot be changed once it is manufactured. Thus ASIC technology requires a project with very high volumes to justify the focused hardware implementation of an ASIC design. Design and implementation schedules are long, especially when re-implementation for error correction is necessary and the fabrication risks are enormous. The costs and risks are accelerating with advances in fabrication technology leading to decreased use of ASIC design implementations.

FPGA suppliers, on the other hand, build wafers of integrated circuit chips that contain blank, programmable logic blocks with similarly programmable interconnects. A customer loads a configuration that defines all the logic blocks and interconnects into the integrated circuit chip. This allows the FPGA logic and interconnect to be programmed in a non-real time fashion after fabrication. This mitigates some of the fabrication risk associated with an ASIC design style. Although it can be targeted at specific functionality, FPGA logic is unable to be re-configured during execution to improve the efficiency of implementation.

Current FPGA integrated circuit architectures were created when the delay of the logic blocks dominated difficulty in design implementation. Fabrication technology has shifted the dominant delay factor to be interconnect RC. Current FPGA interconnect solutions consume more than 50% of the area and timing in solutions. The focus of current FPGA technology on the logic block delay is ill-suited to converge on a timing solution and, thereby, scale with advances in fabrication technology (Moore's Law). This mismatch prevents cost and design time from scaling appropriately with fabrication technology.

Integrated circuit processors provide universal functionality within a single piece of silicon, flexibility, and ease of design. However, such processors are unable to perform some calculations at needed performance levels. ASICs are costeffective in production, and have the maximum available performance, yet cost large amounts of money and time to design. Integrated circuit FPGAs provide some performance acceleration compared to processors, and are flexible devices, yet cost a great deal during production and are difficult to design with.

An implementation platform is needed that has the best attributes of the various solutions including: re-use of hardware, ease of design, and instant reconfigurability of a processor; the performance and field programmability of an FPGA; with cost and power of closer to that of ASIC.

SUMMARY OF THE INVENTION

In accordance with the principles of the invention, a software programmable integrated circuit arrangement is provided. The integrated circuit arrangement comprises apparatus and a methodology to unlock the potential of both hardware and software development styles in a single reconfigurable implementation. Advantageously, the programmable integrated circuit logic arrangement of the invention provides a fine-grained, rapidly reconfigurable computing engine to enable both the high level algorithm management of a processor and concurrent processing.

In accordance with the invention, per-cycle programmable functionality and interconnect are combined into instructions that encompass general functionality. Using this general functionality, computing power can be focused after implementation on design bottlenecks without requiring traditional hardware timing convergence. An instruction stream also provides the flexibility needed to multiplex varied functionality, maintain an efficient implementation through rapid hardware reuse, and design at any level of abstraction.

In accordance with the principles of the invention, a method of computing digital algorithms with an integrated circuit that may be configured to be programmable as part of the manufacturing process or subsequent to the manufacturing process is advantageously provided.

In accordance with the principles of the invention, an integrated circuit for calculating one or more predetermined digital algorithms is provided. The integrated circuit is programmable to operate on input data in accordance with the one or more predetermined digital algorithms. The integrated circuit comprises a first memory portion comprising at least one instruction defining a digital algorithm; a second memory portion comprising configuration data in conjunction with the digital algorithm; and a third memory portion operable to selectively provide data inputs and to receive and store data outputs. A logic computation unit is provided and comprises a programmable array of a plurality of execution units. Each execution unit is programmable to provide Boolean functionality as determined by a portion of one instruction. Each execution unit is programmably interconnected with other execution units in accordance with the configuration data. Each execution unit operates on data inputs from the third memory portion to provide data outputs for storage in the third memory portion. A circuit provides execution clock cycles to the first, second and third memory portions such that the logic computation unit computes the digital algorithm. The execution clock cycles are selected such that the time to compute the digital algorithm is a predetermined time.

In the illustrative embodiment disclosed, an integrated circuit comprises an integrated circuit that is programmable to operate on input data in accordance with one or more predetermined digital algorithms. The integrated circuit comprises a logic computation unit comprising a plurality of execution elements, each execution element is selectively programmable to operate on input data to generate output data having a predetermined Boolean logic relationship to said input data. An instruction memory comprises at least one instruction defining a digital algorithm. The instruction memory is coupled to the logic computation unit to provide a controlled instruction stream to the logic computation unit. The controlled instruction stream controls the predetermined Boolean logic relationship for each execution unit. A state memory is coupled to the logic computation unit to selectively provide data inputs to the logic computation unit and to receive outputs from the logic computation unit. A circuit is coupled to the instruction memory to provide an instruction pointer and is coupled to the state memory to control selection of data inputs to the logic computation unit from the state memory and to control selection of outputs from the logic computation unit for storage in the state memory. The circuit provides execution clock cycles.

Further in accordance with the principles of the invention, a method for providing a programmable integrated circuit for computing one or more digital algorithms, comprising: generating an instruction stream for a digital algorithm to be compiled into logic gates; providing a first memory on the integrated circuit; mapping the instruction stream into a first memory; providing a second memory on the integrated circuit; storing configuration data in conjunction with the digital algorithm in the second memory; providing a third memory on the integrated circuit to selectively provide data inputs and to receive and store data outputs; providing a logic computation unit on the integrated circuit, the logic computation unit comprises a programmable array of a plurality of execution units, each of the execution units is programmable to provide Boolean functionalities as determined by the instruction stream, each of the execution units is programmably interconnected with others of the execution units in accordance with the configuration data and each of the units programmably operating on data inputs from the third memory to provide said data outputs for storage in said third memory; providing input data to the logic computation unit from the third memory during an execution clock cycle; providing the instruction stream to the logic computation unit from the first memory during the execution cycle; providing configuration data to the logic computation unit from the second memory during the execution cycle; and storing output data from the logic computation unit in the third memory during the execution cycle.

BRIEF DESCRIPTION OF THE DRAWING

The invention will be better understood from a reading of the following detailed description of preferred embodiments of the invention in conjunction with the drawing figures in which like reference designators refer to like elements, and in which.

DETAILED DESCRIPTION

In accordance with the principles of the invention, an integrated circuit architecture is provided that includes software-like execution of concurrent digital logic algorithms. The integrated circuit provides for describing a concurrent digital algorithm by means of a string of bits called an "element instruction" and the separation of that instruction from the apparatus for executing it by storing an element instruction stream EIS into a centralized memory, the instruction memory. A logic computation unit that is configured on a clock by clock basis by the element instruction stream computes virtually any digital algorithm. State information is stored in a central repository, state memory, rather than being distributed throughout the architecture avoids requiring management of data distribution from data sources to data sinks. An integrated circuit arrangement in accordance with the principles of the invention can sequence thorough an element instruction stream and can, on the fly, select which digital algorithm to compute.

In accordance with the principles of the invention, a software programmable logic SPL integrated circuit arrangement utilizes a scalable, fine-grained array of rapidly reconfigurable computational and interconnect elements and provides a flexible computation capability that can compute any desired functionality. This flexibility is realized by enabling both control and data design elements to be managed at a design abstraction level appropriate to their computational requirements.

Figure 1:
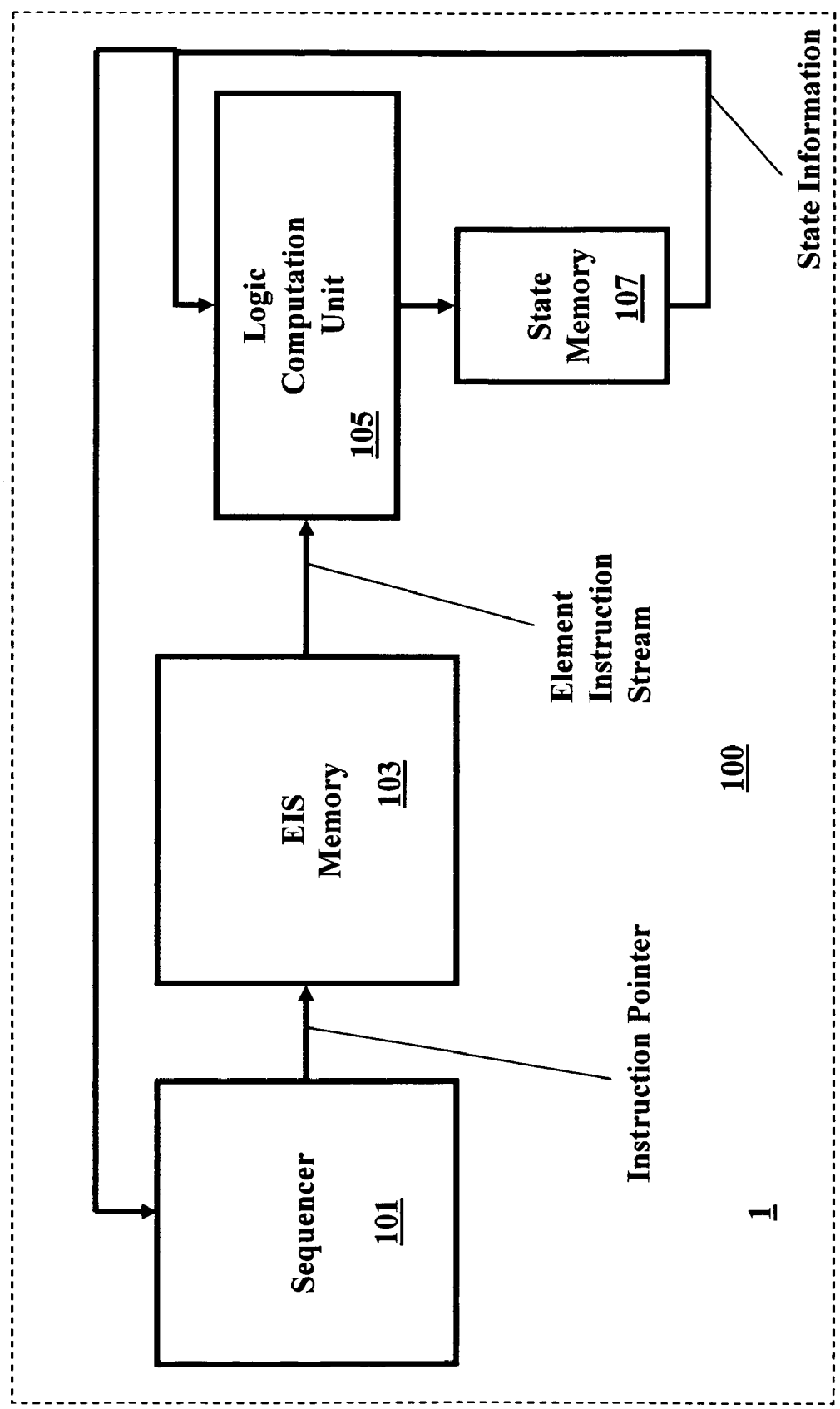
FIG. 1 is a block diagram illustrating an integrated circuit system in accordance with the principles of the invention.

As shown in FIG. 1, integrated circuit 1 comprises an a software programmable logic arrangement 100 that, in turn, comprises a sequencer 101, an element instruction stream memory 103, a logic computation unit or logic execution array 105, and a state memory 107.

Element instruction stream memory 103 stores and provides an element instruction stream EIS. Element instruction stream EIS provides the basis by which software programmable logic arrangement 100 stores and computes digital algorithms. Element instruction streams for different algorithms are stored in element instruction stream memory 103 and are utilized to configure logic computation unit LCU 105, to operate on input data in accordance with a digital algorithm.

Prior art microprocessor instructions are composed of a relatively small number of bits: 8 bits in small microprocessors to perhaps 256 bits in very long instruction word microprocessors. In contrast, the element instruction stream ETS utilized in software programmable logic arrangement 100 may be much longer—in some implementations it may be more than 100,000 bits long. The element instruction stream EIS, or a set of element instruction streams EISs, can describe virtually any digital algorithm and can be used to permit the same hardware to operate in accordance with any number of digital algorithms. By utilizing the programmable capability of element instruction stream memory 103, an integrated circuit comprising the software programmable logic arrangement 100 may be preprogrammed to execute any number of digital algorithms.

The element instruction stream EIS is a basic abstraction element for functional design of software programmable logic arrangement 100. The element instruction stream EIS describes a set of combinatorial computation and data communication in the digital algorithm. Because the element instruction stream EIS provides programming each execution cycle, the element instruction stream EIS enables the rapid reuse of logic computation unit LCU 105.

Figure 3:
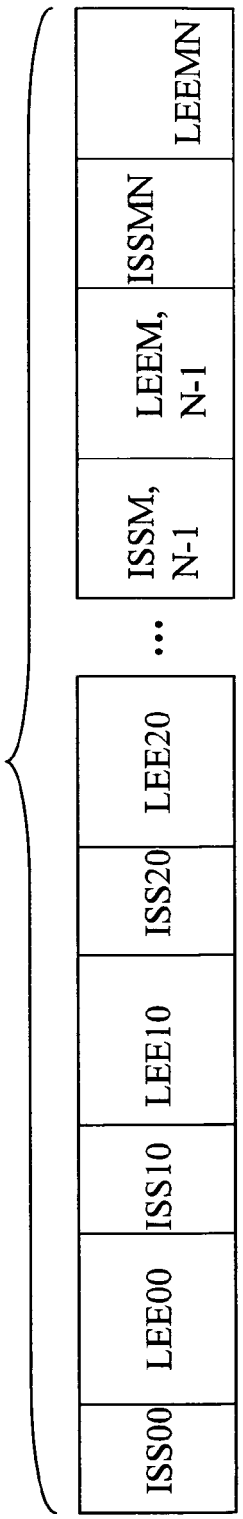
FIG. 3 illustrates an element instruction utilized in the system of FIG. 1.

The specific makeup of the element instruction stream EIS is dependent upon the specific makeup of the logic computation unit LCU 105. Many implementations of the logic computation units LCU 105 are possible in different embodiments of the invention, and thus many implementations of the element instruction stream EIS are possible. In the embodiment of the logic computation unit LCU 105 described below, the element instruction stream EIS is configured as shown in FIG. 3.

Element instruction stream EIS may be generated using standard methods. One such method is logic synthesis, in which a Verilog or VHDL description of the digital algorithm is compiled into logic gates, then mapped into an logic computation unit LCU 105. This mapping generates a specific element instruction stream EIS. Alternatively, electronic system level methods may be used, generating logic gates from a C, C++, SystemC, System Verilog, or other higher level language, which is then mapped into the logic computation unit LCU 105.

Logic computation unit LCU 105 is utilized in software programmable logic SPL arrangement 100 to computes a digital algorithm using the element instruction stream EIS. Logic computation unit LCU 105:

accepts an element instruction stream EIS on each clock cycle;

configures its computation and data interconnect structure to execute the algorithm described by the element instruction stream EIS on each clock cycle;

computes any logic function described by the element instruction stream EIS—virtually any digital logic algorithm describable within that logic state;

accepts state information from state memory 107 on each clock cycle; and stores new state information to state memory 107 on each clock cycle.

Figure 2:
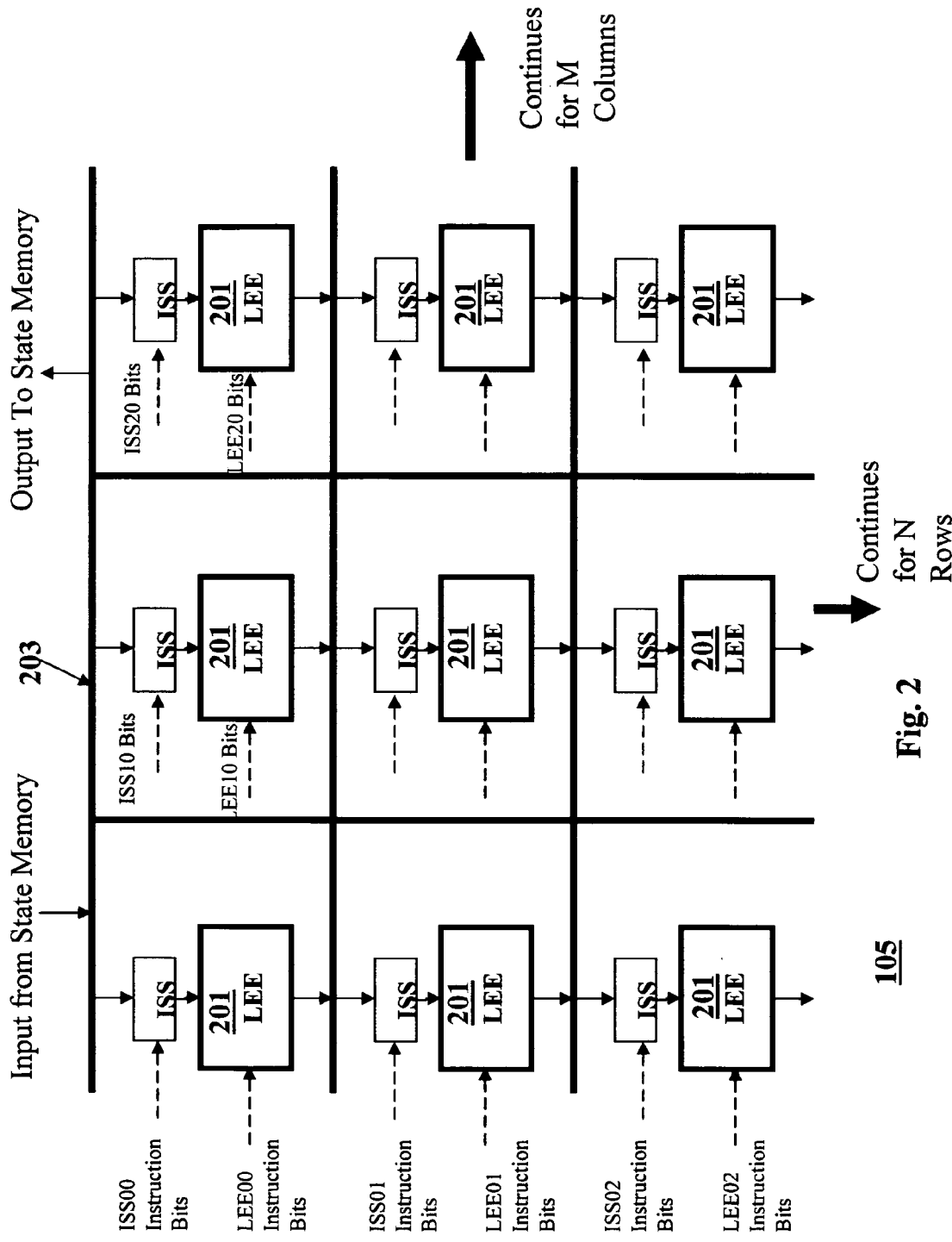
FIG. 2 is a more detailed block diagram of a portion of the system of FIG. 1.

A first embodiment of a logic computation unit LCU 105 is shown in FIG. 2. Logic computation unit LCU 105 comprises an array of a plurality of logic execution elements LEEs 201 arranged as a matrix of M columns and N rows. Each logic execution element LEE 201 performs the basic, fine-grained computation of logic functions, the aggregate of which make up an entire digital algorithm to be computed by the logic computation unit LCU 105. Logic execution elements LEEs 201 are connected by means of an interconnect matrix 203, that provides routing of signals from logic execution elements LEE 201 outputs to logic execution elements LEE 201 inputs. Each logic execution elements LEEs 201 receives inputs from interconnect matrix 203 through the use of an interconnect selection circuit ISS. Interconnect matrix 203 also receives inputs from state memory 107. State memory 107 receives and stores inputs from interconnect matrix 203.

Each logic execution element LEE 201 and input source select ISS take a portion of the bits from element instruction stream EIS. These bits configure logic execution elements LEE 201 to perform a specific piece of the digital algorithm being executed by the logic computation unit LCU 105. Input source select ISS routes data needed by specific logic execution elements LEE 201 in order to compute the digital algorithm.

Logic computation unit LCU 105 comprising combined array of logic execution elements LEEs 201, input source select ISS, and the interconnect matrix 203 can compute the combinatorial portion of any digital algorithm that can be described within the element instruction stream EIS. The array of logic computation unit LCU 105 array can be made as large as necessary such that any arbitrarily large digital algorithm can be computed.

Logic computation unit LCU 105 is combinatorial only. Registers and other storage elements typically found within a digital algorithm are not included within logic computation unit LCU 105. Storage of combinatorial states is centralized within state memory 107 as described below.

Interconnect matrix 203 routes data signals from where they are output, either logic execution elements LEE 201 outputs or state memory 107 outputs, to where they are to be input, either logic execution elements LEE 201 inputs or state memory 107 inputs. In an integrated circuit embodiment of the invention, the interconnect matrix 203 may be provided by metallization layers.

Figure 4B:
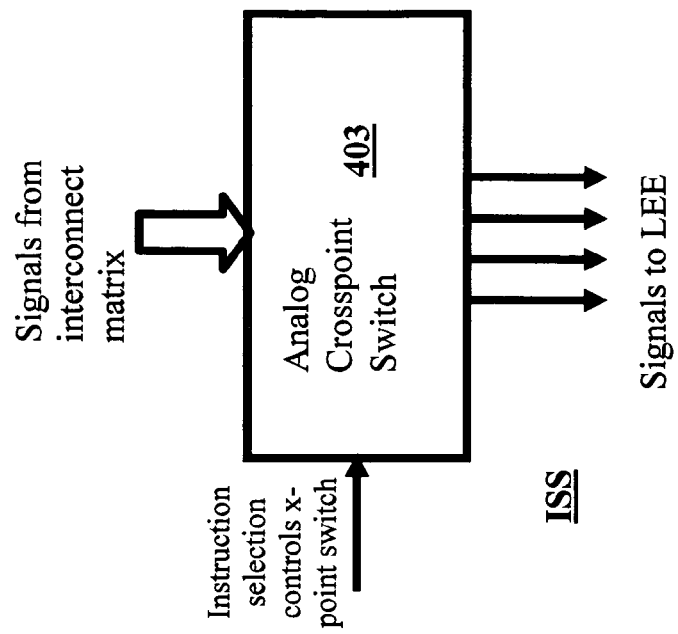
FIGS. 4B illustrates one alternate embodiment of the arrangement of FIG. 4A.
Figure 4A:
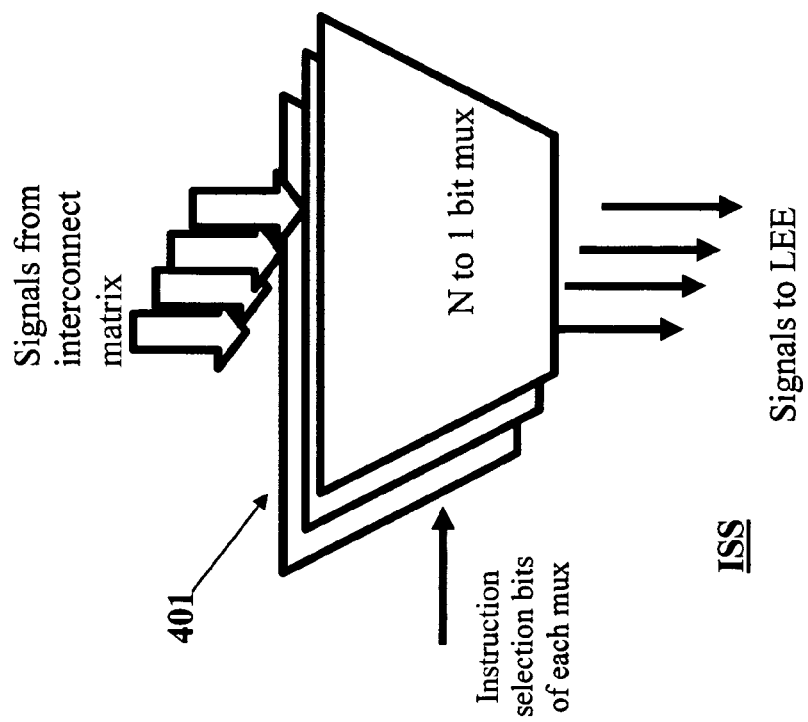
FIGS. 4A illustrates in greater detail a portion of the block diagram of FIG. 2.

Input source select function is provided by selecting proper data from interconnect matrix 203 and routing it to a specific logic execution element LEE 201 based upon a set of element instruction stream EIS bits. FIGS. 4A and 4B shows two alternate embodiments of input source select ISS. It will be appreciated by those skilled in the art will appreciate that other embodiments may be utilized. Input source select ISS shown in FIG. 4A is a multiplexing arrangement, where a plurality of bits from interconnect matrix 203 are input to a multiplexer 401 of a predetermined selectable width. Instruction bits are connected to the select inputs of multiplexer 401 thereby selecting one or more data bits from interconnect matrix 203 to be input to a logic execution element LEE 201. Logic execution elements LEE 201 takes in 4 bits of data, so that the input source select ISS comprises 4 such multiplexers, one for each bit.

A second embodiment of input source select ISS shown in FIG. 4B is an analog crosspoint switch 403. A number of bits from interconnect matrix 203 is input to crosspoint switch 403. The instruction bits select which input bits get connected to which outputs. This performs the exact same function as multiplexer 401 but is a different physical mechanism to achieve the same function.

There are many ways to connect interconnect matrix 203 to the individual input source select ISS units. In some embodiments, the connection might be universal, that is, all bits of the interconnect matrix 203 are connected to each input source select ISS. In other embodiments, only certain bits of the matrix 203 are connected to each input source select ISS. In one such embodiment all input source selects ISS within a X by Y portion of the logic computation unit LCU array 105 are interconnected. Thus every logic execution element LEE 201 has inputs from all of its immediate neighbors. In another embodiment, each row of logic execution elements LEE 201 feeds the row below, so that a logic execution element LEE 201 can get inputs from all logic execution elements LEE 201 in the row above, but not from rows below. Other embodiments will be apparent to those skilled in the art and the selection of the particular embodiment will be dependent upon the types of digital algorithms the logic computation unit LCU 105 is to calculate.

Figure 5:
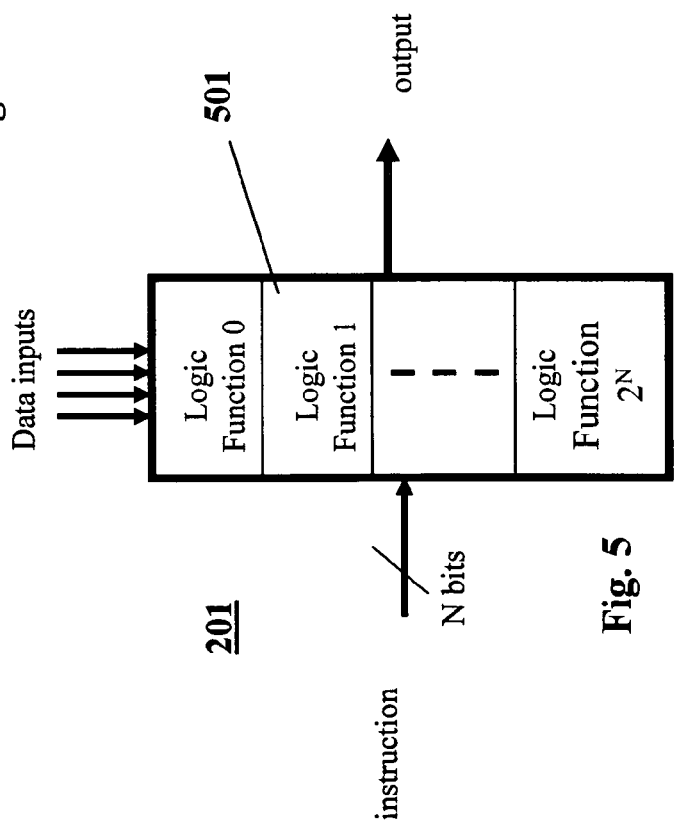
FIG. 5, on the same sheet as FIG. 3, illustrates a logic execution element utilized in the logic computation unit of FIG. 2.

Logic execution element 201 is a unit fine-grained enough to compute low-level logic functions. Unlike look-up tables used in field programmable gate arrays, logic execution element LEE 201 must be able to change its function each clock cycle based upon the bits of instruction it receives. FIG. 5 illustrates an embodiment of logic execution element LEE 201. Though other implementations are possible, in this embodiment, logic execution element LEE 201 is a memory 501 with multiple entries. The instruction has a predetermined number of bits N. If the number of instruction bits is 4, then there are 4×4 locations within memory 501, and the 4 bits of instruction act as the high-order bits of address. Memory 501 is loaded with the possible logic functions upon power-up, much as in a standard field programmable gate array. During each clock cycle the instruction provides the high order address bits, the data provides the low order address bits, and the result is a single bit output from the memory. The write structure of memory is not shown for purposes of clarity.

Other embodiments of logic execution element LEE 201 are possible including embodiments that are implemented with: standard look-up tables; arithmetic logic units; arrangements of gates that produce pre-configured logic functions based upon the data and the instruction; and multipliers, adders, and subtractors.

Figure 6:
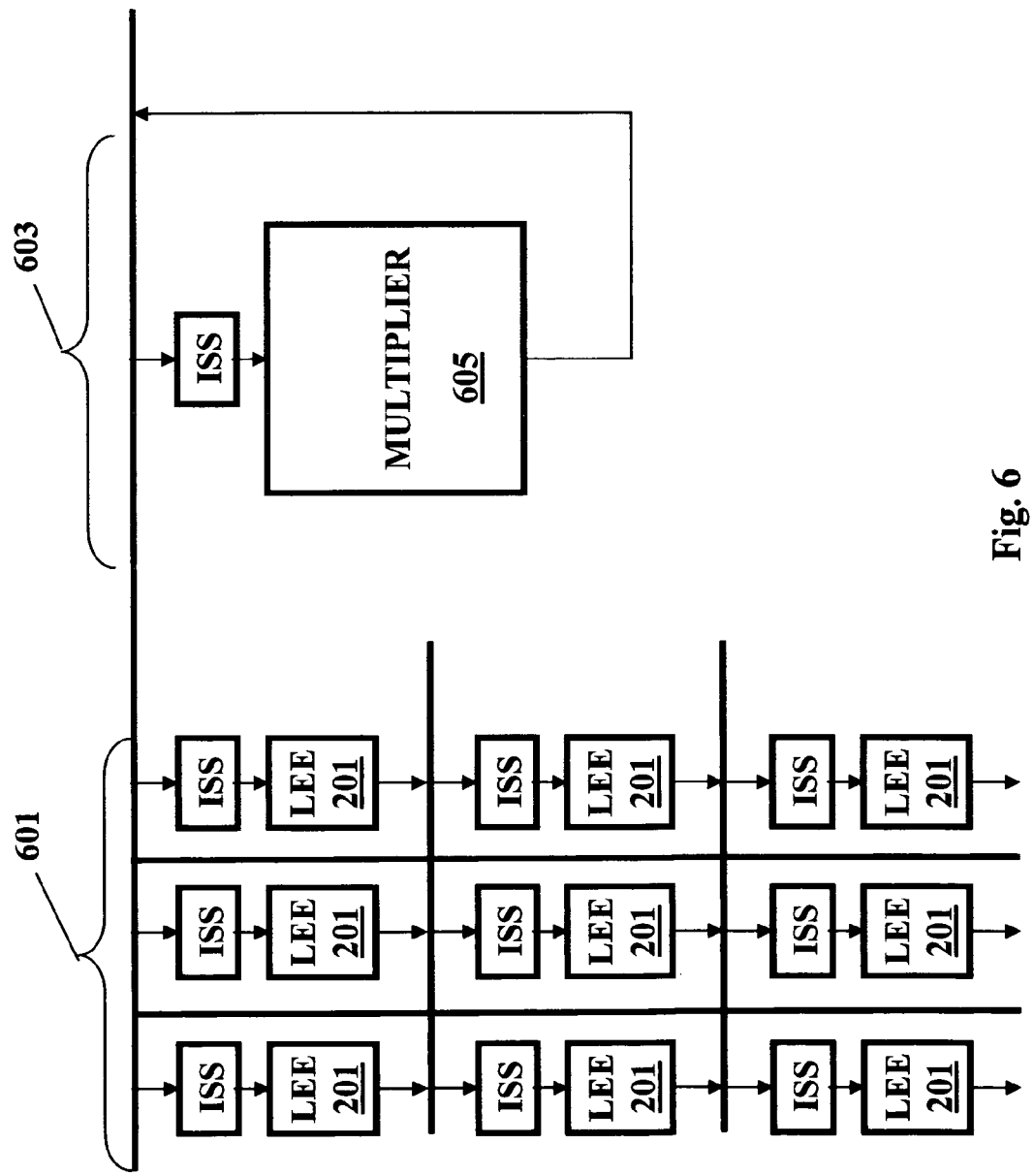
FIG. 6 illustrates an example of a non-homogenous logic computation unit utilizable in the system of FIG. 1.

Logic execution elements LEE 201 do not need to be homogenous within a specific implementation of logic computation unit LCU 105. That is, there could be, in any single instantiation of logic computation unit LCU 105, multiple types of logic execution elements LEE. As shown in FIG. 6, a logic computation unit LCU 105 comprises a set of columns 601 of memories 201 as described above is combined with another set of columns 603 that contain multipliers 605. For purposes of clarity, only one multiplier 605 is shown.

Figure 7:
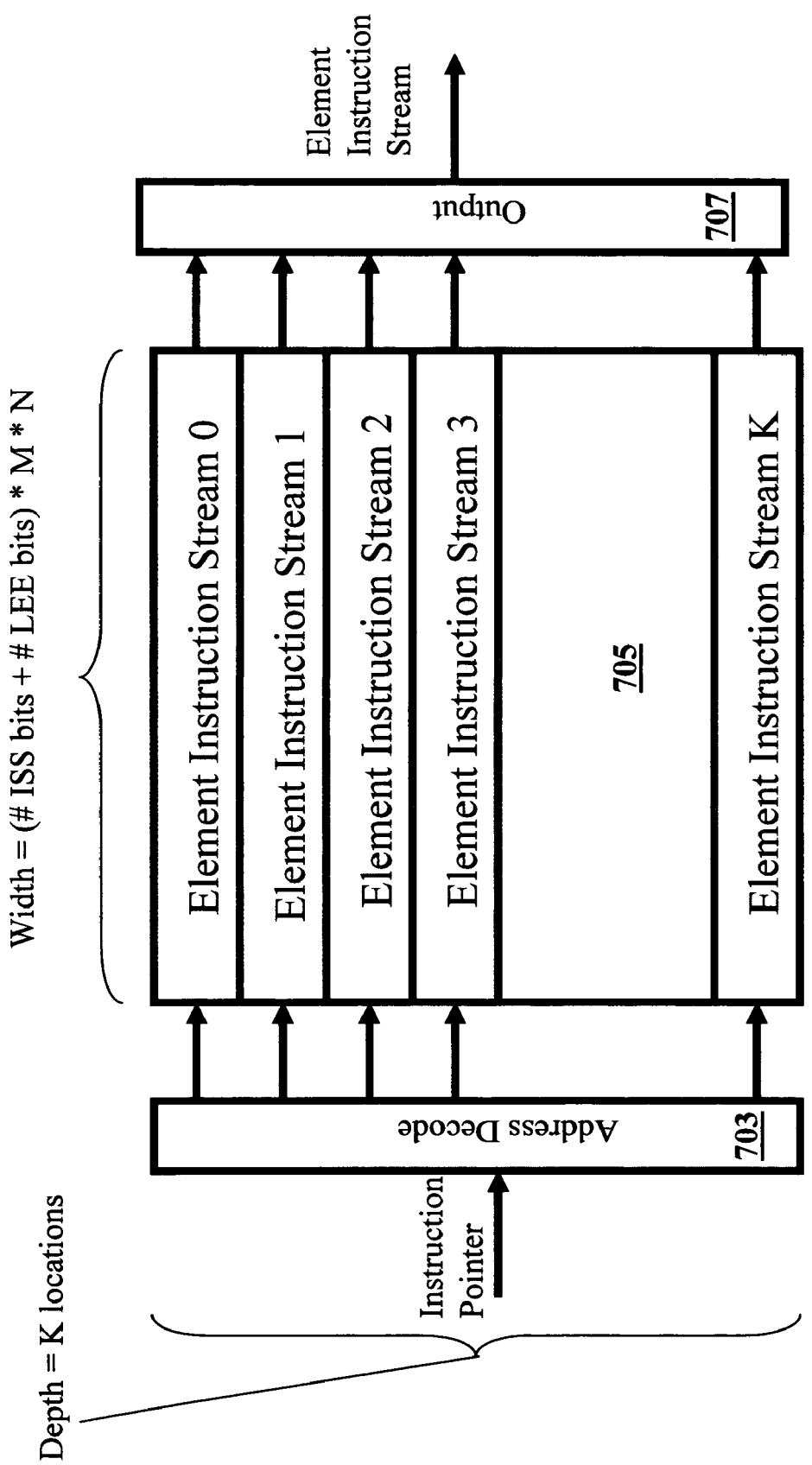
FIG. 7 illustrates in greater detail, the instruction stream memory of the system of FIG. 1.

Element instruction streams EIS are stored in an element instruction stream EIS memory 103 as shown in FIG. 7. EIS memory 103 is a memory that is wide enough for the element instruction streams EIS to configure logic computation unit LCU 105 and contains enough locations to fit all of desired digital algorithms. For logic computation unit LCU 105 described above, the width of an instruction is the number of bits needed to configure an input source select ISS added to the number of bits needed to configure a logic execution element LEE 201, the sum is multiplied by the total number of logic execution elements LEE 201, or for an N×M array, N multiplied by M element instruction stream EIS memory 103 must supply the element instruction stream EIS to logic computation unit LCU 105 at the clock rate. EIS memory 103 accepts an instruction pointer from a sequencer, decodes the address with decoder 703, reads an element instruction stream from memory module 705 and sends the proper element instruction stream EIS to memory outputs 707.

Other embodiments of element instruction stream EIS memory 103 are possible. By way of example, other embodiments may use various distributed memory techniques. Still further many types of memory, e.g., SRAM, one-time-programmable, ROM, may be utilized according to the application space under consideration. The amount of element instruction stream EIS memory 103 is scalable according the application space.

Figure 8:
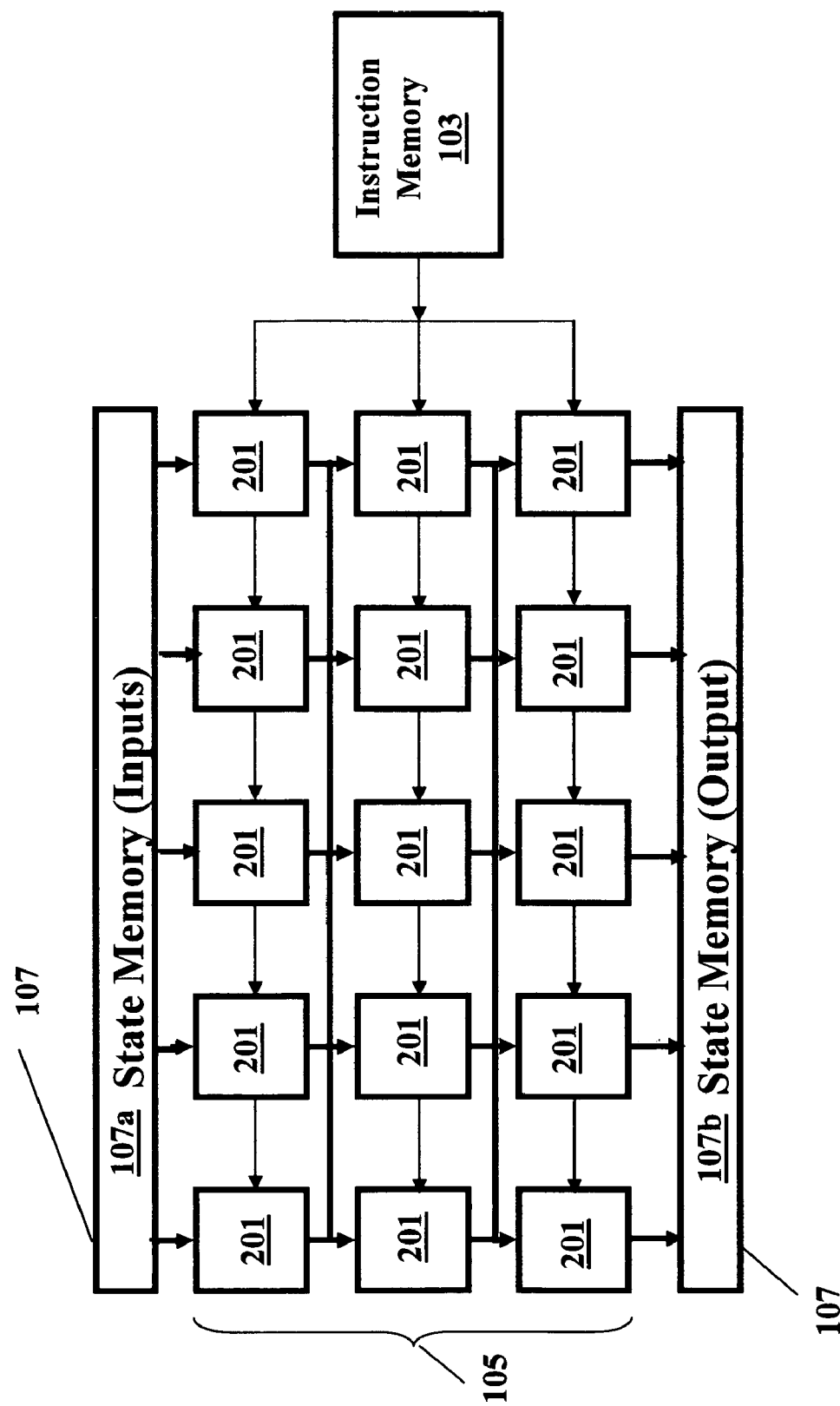
FIG. 8 illustrates the relationship between state memory, instruction memory and the logic computation unit of the system of FIG. 1.

FIG. 8 shows state memory 107 in two portions 107a, 107b. State memory 107 is utilized to preserve data between cycles of the logic computation unit LCU 105. Inputs to logic computation unit LCU 105 array are provided from memory portion 107a during each execution cycle. The outputs from logic computation unit LCU 105 array go to memory portion 107b each cycle. Signals are propagated in state memory 107 from one clock cycle to another.

State memory 107 is used to generate initial inputs during an execution cycle of the array. State memory 107 is also used to preserve the outputs after an execution clock cycle. In this way, state memory 107 provides many data related functions that are similar to: inputs and outputs in ASIC and FPGA design; registers in ASIC and FPGA design; interconnect in ASIC and FPGA design; and processor registers in software design.

By operating at a higher level of abstraction, state memory 107 provides data management capabilities not available in ASIC or FPGA design. State memory 107 provides the capability to make data virtually available at many points within the implementation space without the customary physical overhead associated with ASIC and FPGA input/output, registers, and interconnects. In this way, state memory 107 simplifies and abstracts timing management traditionally associated with hardware design.

State memory 107 provides a mechanism to keep data physically close to the programmable computational components and optimize data traffic. In this way, state memory 107 is targeted at technology scaling.

Other embodiments of the invention may utilize use a "paging" like implementation to provide a larger state memory 107 space than can efficiently be provided by a physical memory. Although it is shown as two memory portions 107a, 107b, other physical allocations are possible. Trade-offs may be made between data interconnectivity in a targeted algorithm and physical constraints. In one embodiment a selection mechanism enables particular state memory bits to be targeted at particular array input bits. Another selection mechanism enables array outputs to be targeted at particular state memory bits.

Figure 9:
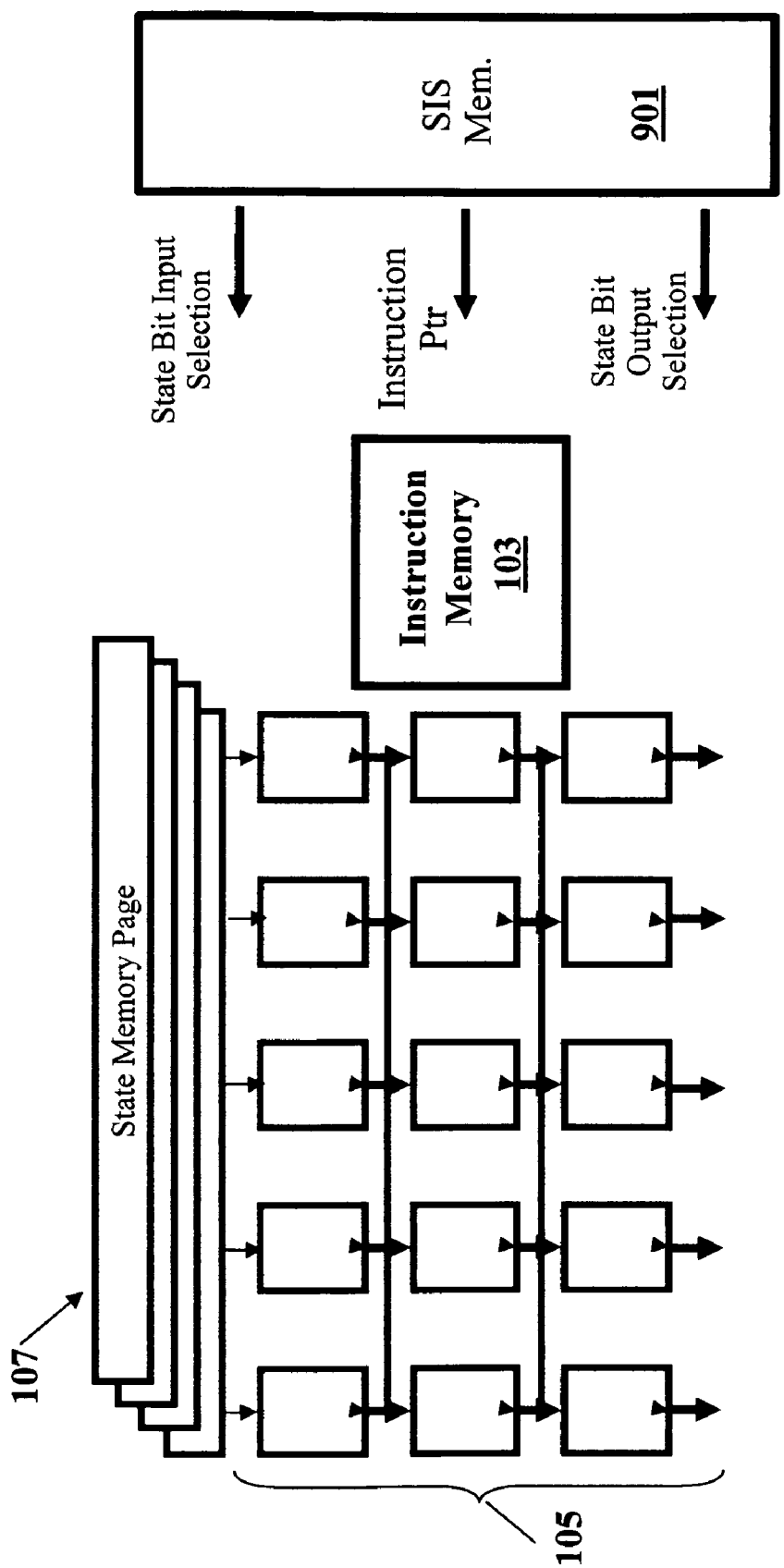
FIG. 9 illustrates the relationship between state memory, instruction memory and the logic computation unit of the system of FIG. 1 and an SIS memory.

A sequencer instruction stream memory 901, shown in FIG. 9, contains configurations data used to combine an element instruction stream EIS configuration with a state memory configuration on a per cycle basis. Similar to EIS memory 107, the sequencer instruction stream SIS configuration data set needed during one cycle of operation is referred to as a SIS instruction.

A sequencer instruction stream SIS instruction uses the state memory 107 bit selection mechanism to select the appropriate inputs from state memory 107 to use as inputs to the logic computation array LCU 105 array of logic execution elements LEE 201. The same sequencer instruction stream SIS instruction provides an instruction pointer to select a particular element instruction stream EIS instruction and thereby program logic computation LCU 105. The same sequencer instruction stream SIS instruction also uses the state memory 107 bit selection mechanism to select the appropriate state memory location in which to save the outputs of the array.

Figure 10:
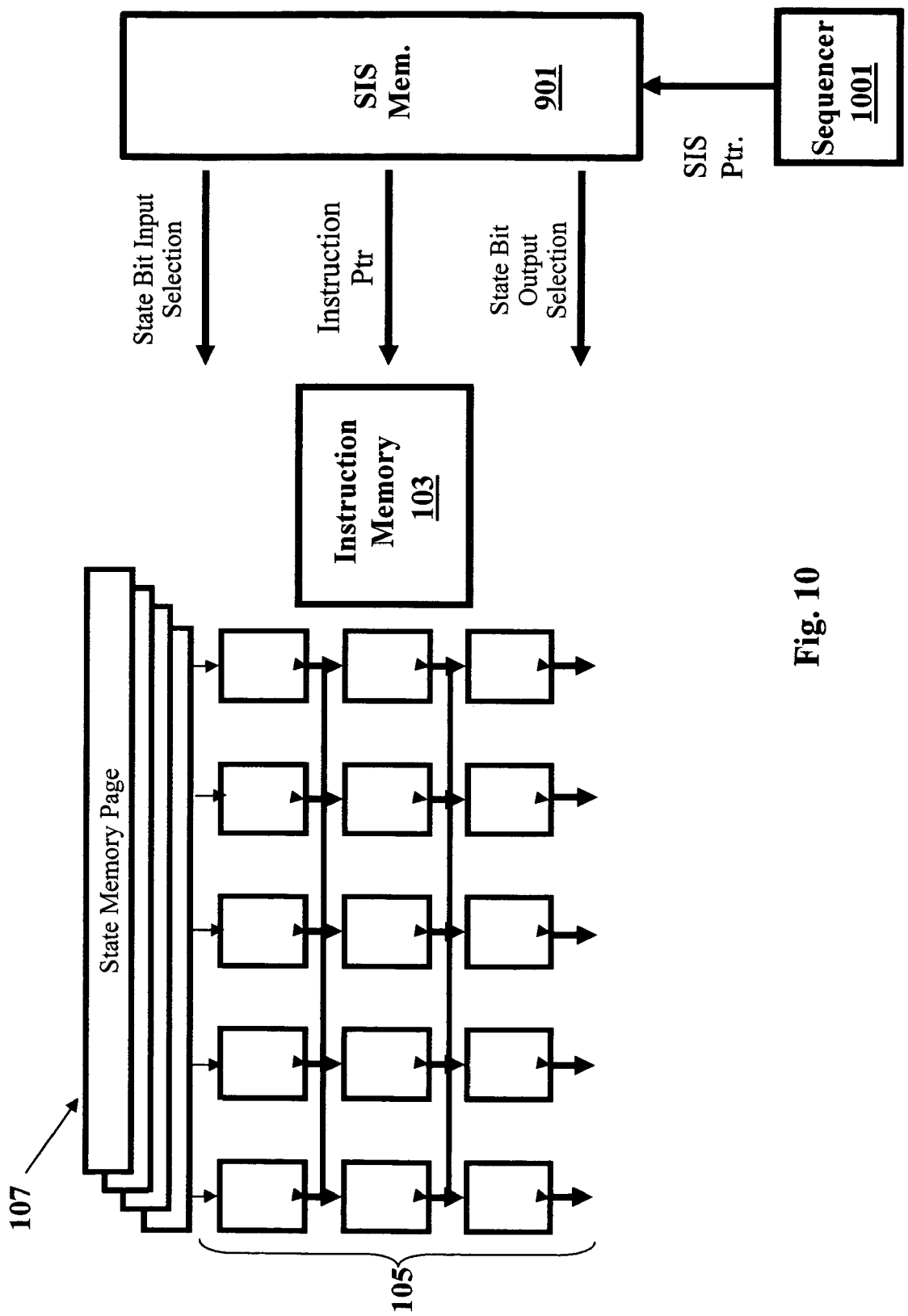
FIG. 10 illustrates the relationship of the arrangement of FIG. 2 and a sequencer.

Turning now to FIG. 10, sequencer 101 is coupled to sequencer instruction stream memory 901 and selects sequencer instruction stream SIS instructions using a pointer. Sequencer 101 is capable of selecting any order and length of sequencer instruction stream SIS instructions. The selects are ordered according to requirements of each digital logic process or based upon data contained within state memory 107. Thereby, sequencer 1001 can provide fixed and data dependent control operation. Additionally, both continuous and limited instruction stream lengths may be provided. Sequencer 101 provides a level of hardware flow control for digital logic processes that can be scaled according to the algorithm to be implemented.

By allowing constituent instructions to be intermingled in their execution, concurrency requirements are easily be managed within and between digital logic processes while the general control flow of each digital logic process is maintained. In this way, sequencer 101 enables the encapsulation of digital logic processes within the general scheme of the overall digital algorithm. Functionality can be partitioned and sequenced according to the requirements of the overall digital algorithm while maintaining the robustness of each process.

In addition to modification directly by the sequencer 1001, the sequencer instruction stream SIS pointer can be written using the outputs of the logic control unit 105. In this way, the output of any logic computation unit LCU 105 execution can be used to change the next executing SIS instruction and thereby the SIS instruction stream flow. Thereby, logic computation unit LCU 105 can be used for data and flow control computations. A write of the sequencer instruction stream SIS pointer from the outputs of the logic control unit LCU 105 enables and provides functionality that is similar to the branch and jump flow control instructions of a processor.

Figure 11:
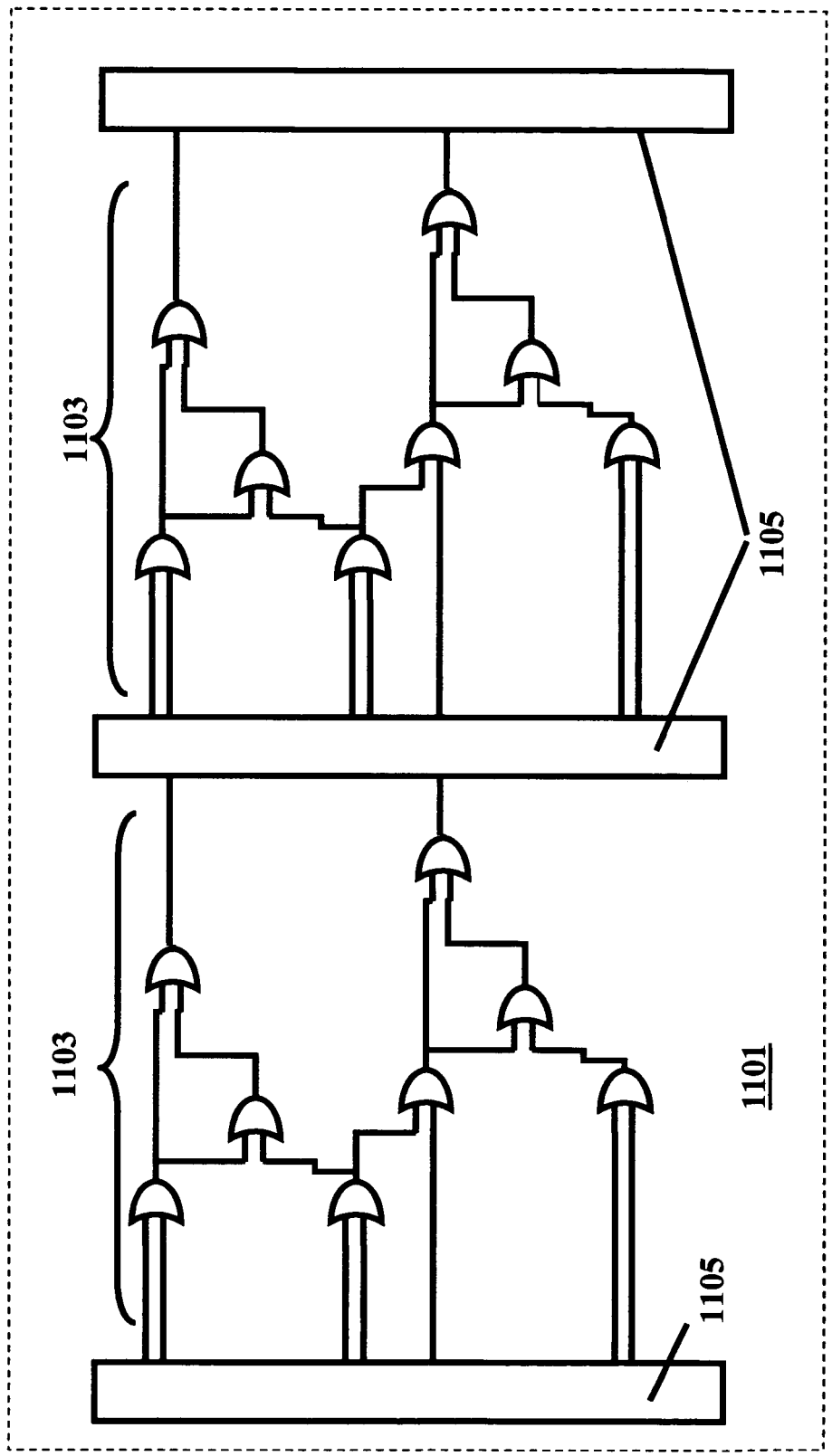
FIG. 11 illustrates a prior art FPGA arrangement.

FIG. 11 shows how a simple digital algorithm is placed and calculated within a prior art field programmable gate array FPGA 1101. Combinational logic 1103 is utilized to calculate the algorithm, but registers 1105 are required to store input, intermediate and output data. The gates of combinational logic 1103 is mapped into look-up tables and once the mapping is performed the FPGA can not be changed. The function of FPGA becomes static.

In SPL 100 in accordance with the principles of the invention each state is simultaneously provided to logic computation unit LCU 105, gate functions are programmed into logic execution elements LEE 201, and interconnects are programmed via the interconnect matrix 203. Instead of dedicated and distributed registers, SPL 100 stores the inputs, intermediate values, and the outputs into the state memory 107. The second stage will get the inputs from the proper place in state memory 107, as defined by the element instruction stream EIS. Thus, though the topology looks different from that of field programmable gate array FPGA 1101, SPL 100 can perform any function a field programmable gate array FPGA can, given the right amount of resources within an logic computation unit LCU 105.

However, in contrast with a field programmable gate array FPGA, logic computation unit LCU 105 can compute another, completely different digital algorithm given a different element instruction stream EIS.

Figure 12:
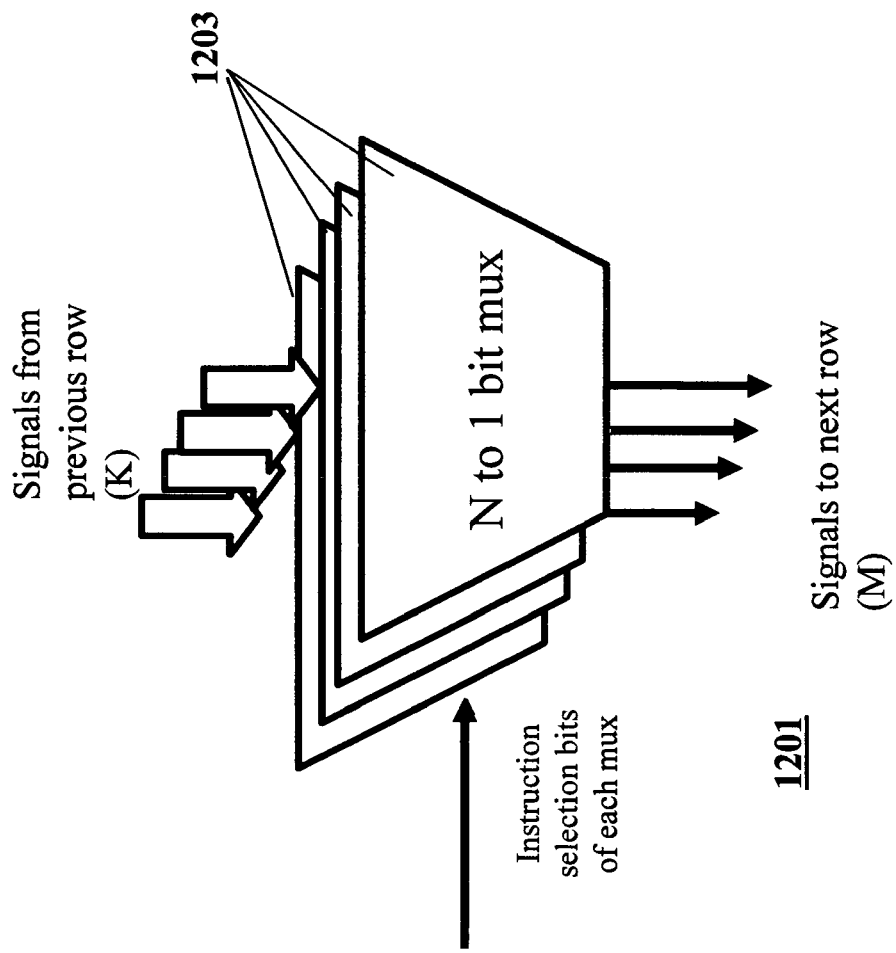
FIG. 12 illustrates a pass unit in accordance with the principles of the invention.

FIG. 12 illustrates an embodiment of the lowest unit of reconfigurable interconnect, a logic-level interconnect involving a relatively small number of data bits, referred to as a "pass unit." Pass unit 1201 is a K input and M output logical interconnect structure that, in the illustrative embodiment is implemented as a set of K to M multiplexers 1203 using a $\log 2^K$ selector. The four multiplexers 1203 shown in FIG. 12 provide an example of this functionality. Although this embodiment utilizes functional multiplexers, other unidirectional interconnect embodiments may be utilized, including, but not limited to pass gates and tri-state drivers.

Pass unit 1201 provides interconnect from any K outputs to any M inputs. By way of example pass unit 1201 might use an 8 input and 1 output multiplexer 1203 and would be referred to as having a window of 8.

Similar to the per-cycle logic execution element LEE programmability, pass unit 1201 provides unique connection between outputs and inputs on a per clock cycle basis using an instruction. Instructions may be provided by instruction memory 103 and instruction selection from sequencer 101 as for logic execution element LEE.

Pass unit 1201 provides the lowest level of interconnect configuration. Pass unit 1201 functions similar to custom routing in an ASIC or FPGA design by providing customizable interconnect between logic execution elements LEE. Pass unit 1201 input connections are distributed to the outputs of adjacent and remote logic execution elements LEE. Pass unit 1201 provides interconnect functionality with consistent timing delay. The per clock cycle instruction enables interconnects provided by pass units 1201 to change every clock cycle.

The number of pass units 1201, their placement and window within logic computation unit LCU optimize many factors, including combinations of the following factors: the amount of local interconnectivity associated with a given digital algorithm or class of algorithms; the amount of global interconnectivity associated with a given digital algorithm or class of algorithms; the RC wiring delay associated with a particular fabrication technology; and the expense of providing per-cycle instruction bits.

Pass unit 1201 provides a unidirectional interconnect scheme. In this way, pass unit 1201 improves the integrated circuit technology and scalability issues associated with the bidirectional field programmable gate array FPGA interconnect.

Figure 13:
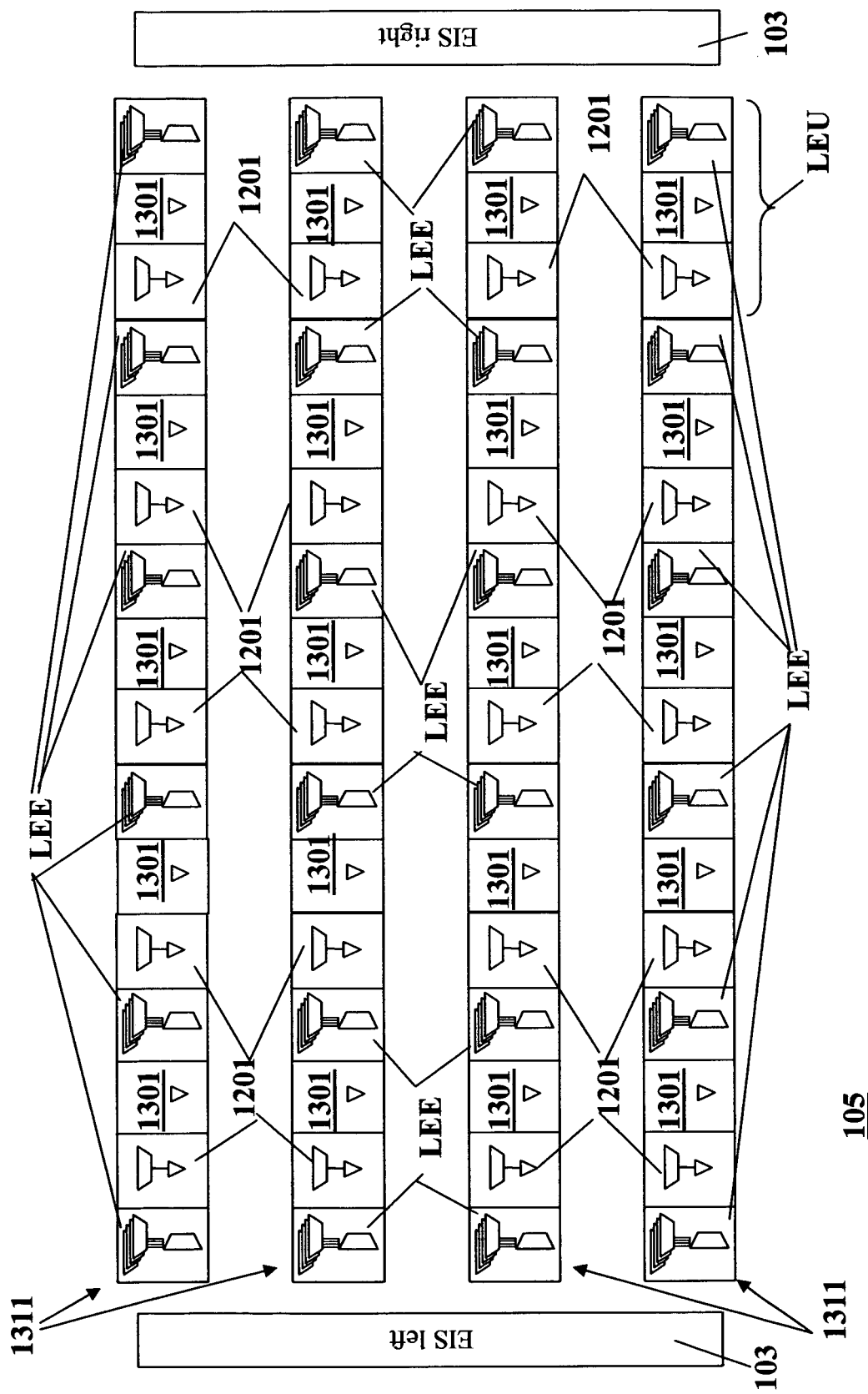
FIG. 13 illustrates an interconnection of logic execution elements and pass units in accordance with the principles of the invention.

One embodiment of a logic execution array logic computation unit LCU 105 is illustrated in FIG. 13. Logic computation unit LCU 105 comprises logic execution elements LEE and pass units 1201 combined into a fine grained combinatorial computational array of four rows 1311 and 16 elements per row. Logic execution elements LEE are arranged into an array in which data computation flows from top to bottom to perform a combinatorial computation. Pass units 1201 are distributed and connected in each row 1311 to allow data to traverse from one row 1311 of logic execution elements LEE to the next. Buffers 1301 are provided and are also distributed and connected to allow data to be supplied and received from distant (non-adjacent) locations. In this way, functionality can be more efficiently placed into the logic execution array 105.

All elements within a row 1311 of logic computation unit LCU 105 meet minimum timing requirements, and thereby, enable a guaranteed timing for the entire array. In this way, timing for the execution by logic computation unit LCU 105, regardless of programmed functionality, is kept constant.

To maintain consistent timing, a row 1311 of logic execution elements LEE generally receives its inputs directly from the outputs of an adjacent row 1311 of logic execution elements, which as shown in FIG. 13, is the adjacent above row of logic execution elements LEE. Each logic execution element LEE and each pass unit 1201 have timing delays such that the execution time of logic computation unit LCU 105 is consistent even as logic execution element LEE and pass unit 1201 programming varies. No data storage is done within logic computation unit LCU 105, and computation is done using one clock cycle. In this way, each execution of the logic execution array lea 105 is performed in one clock cycle of equal time that is independent of the digital algorithm being computed. This consistent timing simplifies timing convergence and allows design in a software programmable logic SPL architecture to enable high-level, software-like implementation techniques.

Figure 14:
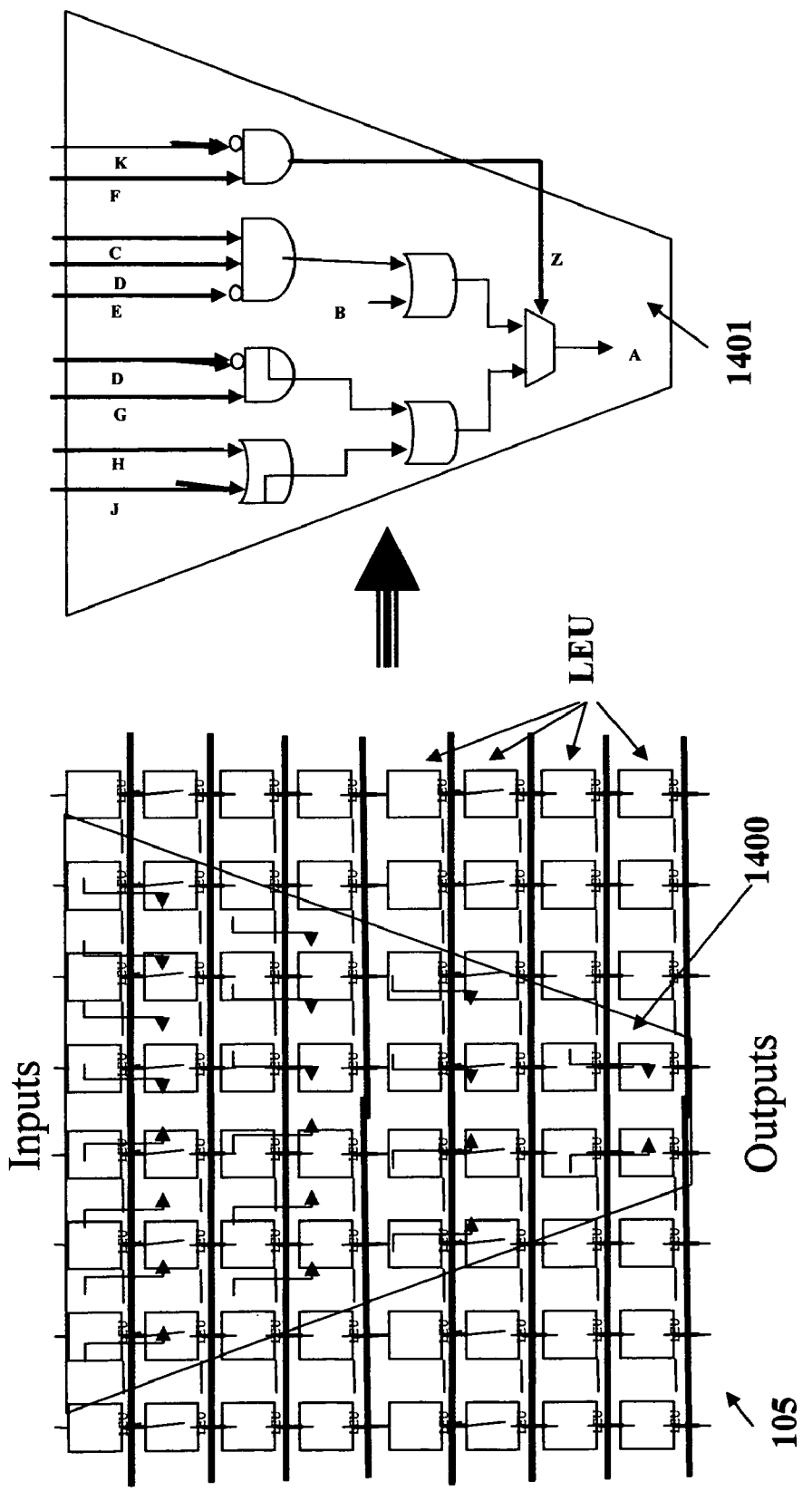
FIG. 14 illustrates one functional configuration of an array of logic execution elements.

A complete combinatorial function can be computed in a single array cycle of SPL 100 as shown in FIG. 14. The logic function 1401 is applied to logic computation unit LCU 105 which is represented as an array of logic execution units LEUs symbolized as squares. Each logic execution unit comprises a logic execution element LEE, pass unit 1201 and buffer 1301 as shown in FIG. 13. Pass unit 1201 functionality is detailed as lines of interconnect in FIG. 14. The element instruction stream from EIS memory 103 for both logic execution elements LEEs and pass units 1201 can be programmed to match logic function 1401. Thereby, a "cone" 1400 of logic functionality can use logic execution element LEE functionality to perform logic functionality and can use pass unit 1201 functionality to perform interconnect functionality. Function inputs and outputs are managed by state memory 107.

Figure 15:
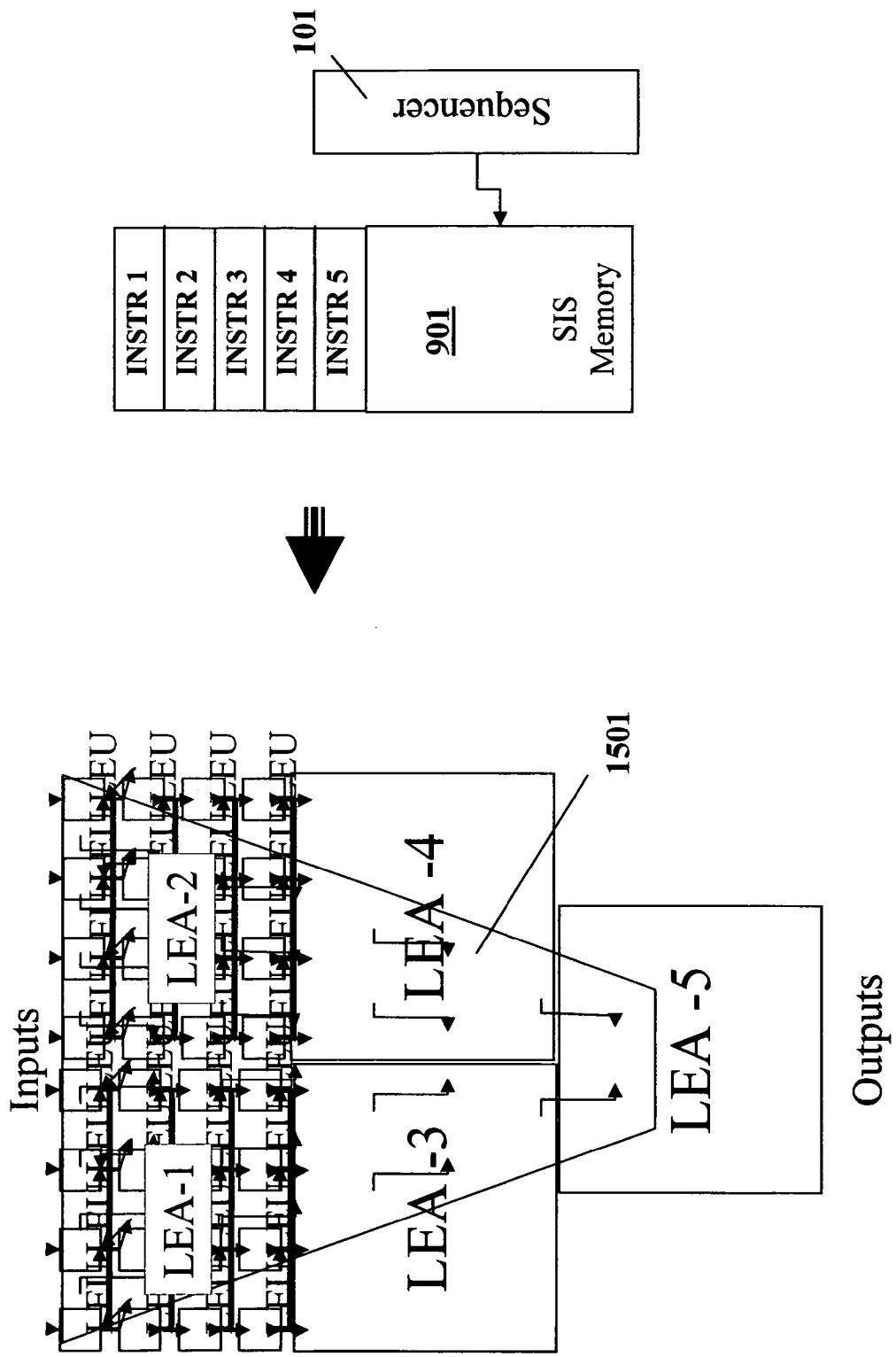
FIG. 15 illustrates a functional utilization of the system of FIG. 1 to provide computation of a digital algorithm.
Figure 16:
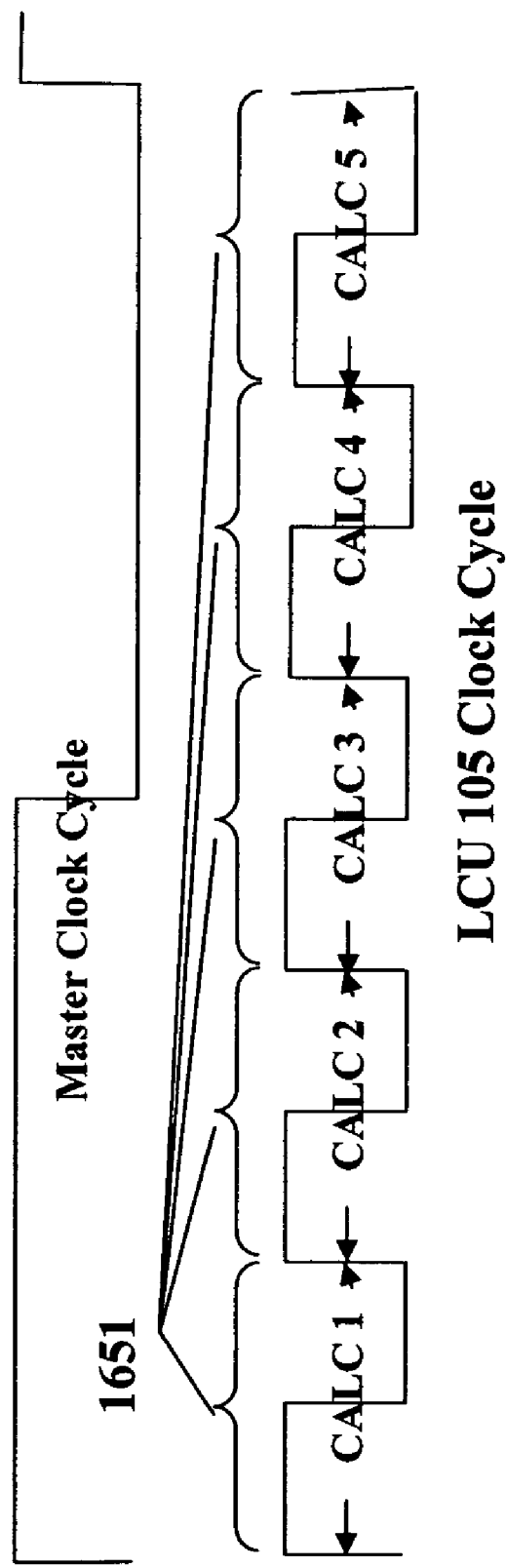
FIG. 16 illustrates clock and execution clock waveforms for the arrangement of FIG. 15.

FIG. 15 and the clock waveforms of FIG. 16 illustrate how multiple instructions can be used to encompass large design sizes. A large cone 1501 of logic functionality can be accomplished by decomposing it into smaller quanta to be computed using multiple sequencer instruction select SIS instruction cycles 1651. In FIG. 15, logic computation unit LCU 105 is shown symbolically as a plurality of logic execution arrays. Logic cone 1501 is shown to be overlayed with logic computation unit execution array cycles LEA1, LEA2, LEA3, LEA4, LEA5. Sequencer instruction select SIS instructions INSTR1, INSTR2, INSTR3, INSTR4, INSTR5 are used to execute the unique functionality of each logic computation unit LCU 105 array cycle 1351. In addition to managing inputs and outputs, state memory 107 provides the capability to manage intermediate data between execution of the instructions. In ASIC or FPGA design, these intermediate data signals might be a combination of nets and registers.

Figure 17:
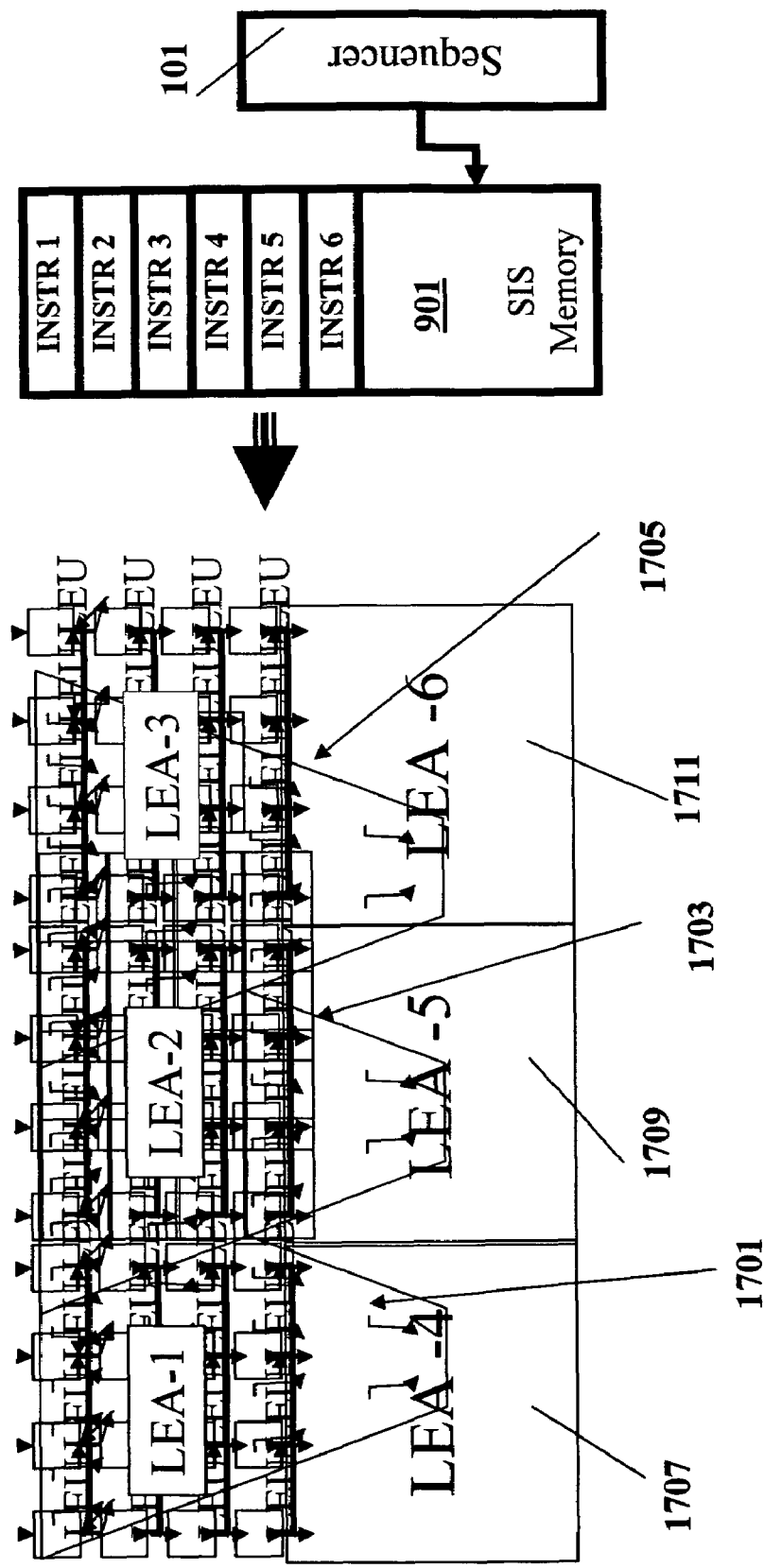
FIG. 17 illustrates a second functional utilization of the system of FIG. 1 to provide computation of a digital algorithm.
Figure 18:
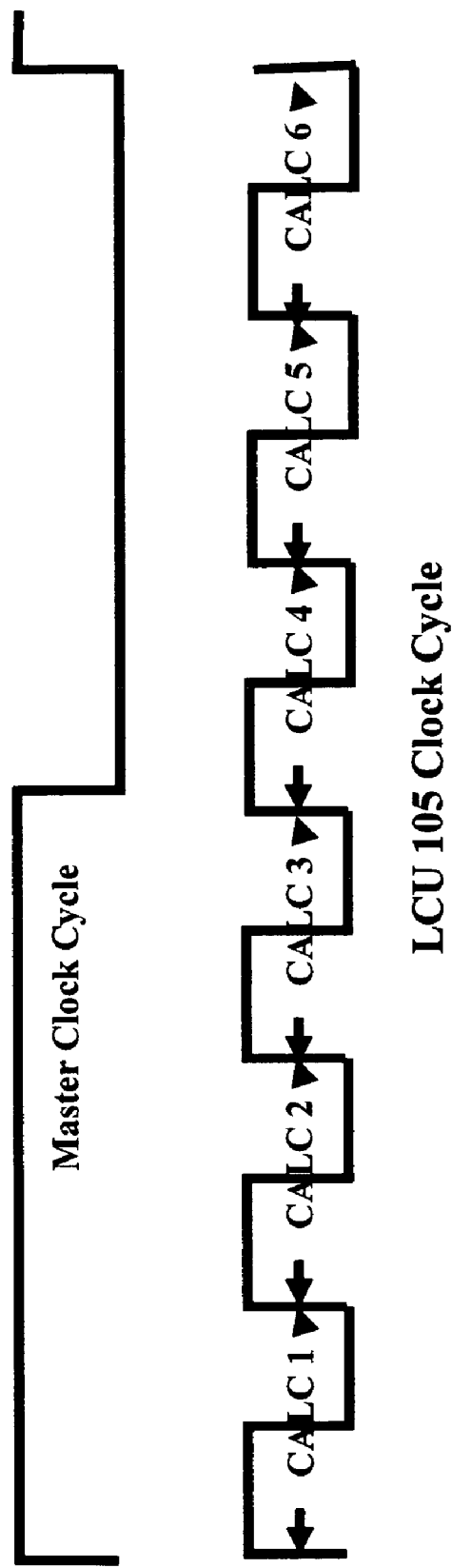
FIG. 18 illustrates clock and execution clock waveforms for the arrangement of FIG. 17.

FIG. 17 and the clock waveforms of FIG. 18 illustrates how multiple functions can be computed within the same cycle(s). Multiple cones of functionality 1701, 1703, 1705 can be accomplished using multiple sequencer instruction select SIS instruction cycles. The logic cones 1701, 1703, 1705 are shown to be overlayed with array cycles 1707, 1709, 1711. Sequencer instruction select SIS instructions from sequencer instruction select memory 901 are used to execute the unique functionality of each array cycle. Portions of data-independent logic computation can be accomplished within the same SIS instruction cycle. FIG. 17 exemplifies how SPL provides low-level concurrency trade offs appropriate for the algorithm under consideration.

Figure 19:
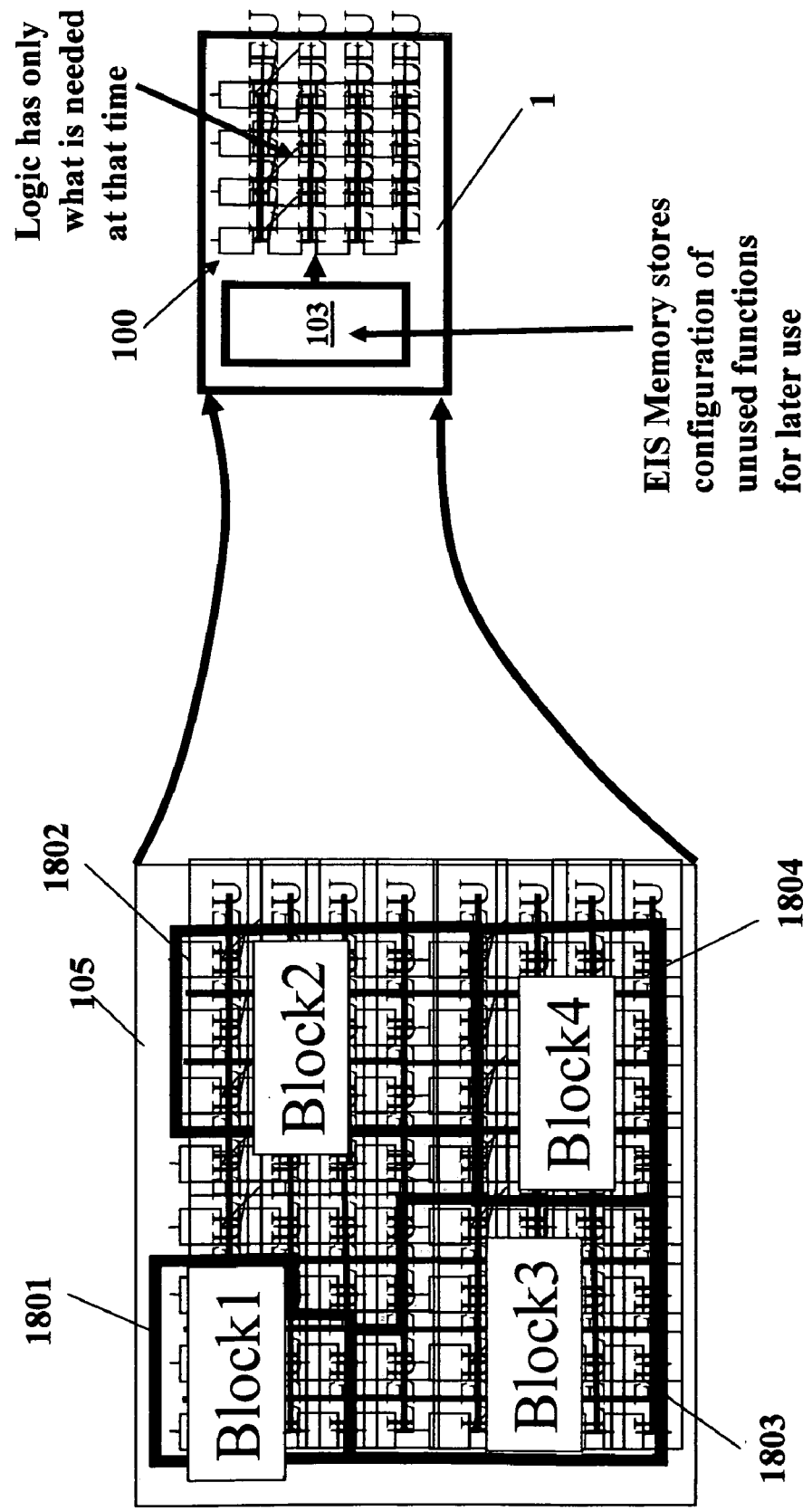
FIG. 19 illustrates a further functional utilization of the system of FIG. 1.

FIG. 18 illustrates how high abstraction-level, hardware design composed of 4 blocks 1801, 1802, 1803, 1804 can time multiplex their use of the logic computation unit LCU 105 array and, thereby, reuse the same hardware. A set of sequencer instruction select SIS instructions can be used to accomplish the functionality contained within each block 1801, 1802, 1803, 1804. Sequencer 101, not shown in FIG. 19, controls the order in which the sequencer instruction select SIS instructions for each design block 1801, 1802, 1803, 1804 are executed. This instruction sequence can then be used accomplish the overall algorithm through a reference to the block level entities. The design blocks, comprising their respective sequencer instruction select SIS instructions, can be used by a designer to implement at a high level of abstraction to accomplish the overall algorithm similar to software design.

Advantageously, an integrated circuit in accordance with the principles of the invention may be programmed as part of the manufacturing process such that providing integrated circuits that each execute different digital algorithms will not require different hardware implementations. This simplifies manufacturing and inventory.

In other embodiments of the invention, the integrated circuit may be field programmable, that is, it is programmed subsequent to manufacture.

The present invention provides dynamically configurable logic units that can be programmed to provide a wide variety of digital logic-level functions changeable on a clock cycle by clock cycle basis.

The present invention also provides a method of interconnect between configurable logic units changeable on a clock cycle by clock cycle basis; and provides a method for executing on the configurable logic only those portions of the algorithm needed during a specific cycle, while storing any unneeded logic in memory until it is needed.

A dynamically configurable logic array, made of dynamically configurable logic units and dynamic interconnect, which can execute a wide variety of digital algorithmic-level, computations changeable on a clock-by-clock basis is provided in the arrangement of the invention.

The invention has been described in terms of specific embodiments. It is not intended to limit scope of the invention by the embodiments shown and described. It will be apparent to those skilled in the art that various changes and modifications can be made to the embodiments without departing from the spirit or scope of the invention. It is intended to limit the invention only by the claims appended hereto, giving those claims the broadest permissible interpretation and scope permitted under the law.

What is claimed is:

1. An integrated circuit comprising:
   an integrated circuit programmable to operate on input data in accordance with one or more predetermined digital algorithms comprising:
   a first memory portion comprising at least one instruction defining a digital algorithm;
   a second memory portion comprising configuration data in conjunction with said digital algorithm;
   a third memory portion operable to selectively provide data inputs and to receive and store data outputs;
   a logic computation unit comprising a programmable array of a plurality of execution units, each of said execution units being programmable to provide Boolean functionality as determined by a corresponding first portion of said at least one instruction, each of said execution units being programmably interconnected with others of said execution units in accordance with at least a portion of said configuration data, and each of said execution units programmably operating on said data inputs from said third memory portion to provide said data outputs for storage in said third memory portion;
   and a circuit operable to provide execution clock cycles to said first, second and third memory portions such that said logic computation unit computes said digital algorithm, said execution clock cycles being selected such that the time to compute said digital algorithm is a predetermined time.

2. An integrated circuit in accordance with claim 1, wherein:
   said first and second memory portions are programmed in accordance with said one or more predetermined algorithms as part of the manufacture of said integrated circuit.

3. An integrated circuit in accordance with claim 1, wherein:
   said first and second memory portions are field programmable.

4. An integrated circuit in accordance with claim 1, wherein:
   said logic computation unit operates in cooperation with said first, second and third memory portions during each execution clock cycle of a predetermined plurality of execution clock cycles to execute said algorithm such that one algorithm of said one or more predetermined algorithms is fully executed when said predetermined plurality of execution clock cycles has occurred.

5. An integrated circuit in accordance with claim 4, wherein:
   said logic computation unit is reprogrammed during each subsequent execution clock cycle by corresponding different portions of said one instruction.

6. An integrated circuit in accordance with claim 5, wherein:
   said logic computation unit is reprogrammed during each said subsequent execution clock cycle by corresponding different portions of said configuration data.

7. An integrated circuit in accordance with claim 1, wherein:
   predetermined ones of said data outputs are utilized as said data inputs.

8. An integrated circuit in accordance with claim 7, wherein:
   predetermined ones of said data outputs are intermediate Boolean states in the computation of said digital algorithm.

9. An integrated circuit in accordance with claim 1, wherein:
   said first memory portion comprising a plurality of instructions each said instruction defining a corresponding one digital algorithm of a plurality of digital algorithms.

10. An integrated circuit in accordance with claim 9, wherein:
    said second memory portion comprising pluralities of configuration data, each said plurality of configuration data corresponding to one said digital algorithm of said plurality of digital algorithms.

11. An integrated circuit in accordance with claim 1, wherein:
    each of said execution units comprises a Boolean execution element and an input source select element, each said Boolean execution element being programmable in response to said instruction to provide a Boolean function, each said input source select being programmably controllable by said instruction to determine inputs to its corresponding execution element.

12. An integrated circuit in accordance with claim 1, wherein:
    said logic computation unit comprises an interconnect unit, said interconnect unit being selectively programmable to interconnect selectable ones of said plurality execution units.

13. An integrated circuit comprising:
an integrated circuit programmable to operate on input data in accordance with one or more predetermined digital algorithms comprising:
a logic computation unit comprising a plurality of execution elements, each execution element being selectively programmable to operate on said input data to generate output data having a predetermined Boolean logic relationship to said input data;
an instruction memory comprising at least one instruction defining a digital algorithm, said instruction memory coupled to said logic computation unit to provide a controlled instruction stream to said logic computation unit, said controlled instruction stream controlling said predetermined Boolean logic relationship for each of said execution elements;
a state memory coupled to said logic computation unit to selectively provide data inputs to said logic computation unit and to receive outputs from said logic computation unit;
a circuit coupled to said instruction memory to provide an instruction pointer and coupled to said state memory to control selection of data inputs to said logic computation unit from said state memory and to control selection of outputs from said logic computation unit for storage in said state memory.

14. An integrated circuit in accordance with claim 13, wherein:
said logic computation unit comprises an interconnect unit, said interconnect unit being selectively programmable to interconnect selectable ones of said plurality execution units.

15. An integrated circuit in accordance with claim 14, wherein:
said circuit provides execution clock cycles to said instruction memory, said state memory and to said logic computation unit.

16. An integrated circuit in accordance with claim 15, wherein:
said logic computation unit executes a portion of said digital algorithm during each said execution clock cycles, said integrated circuit completing execution of said digital algorithm after a predetermined number of said execution clock cycles.

17. An integrated circuit in accordance with claim 14, wherein:
said circuit comprises a second instruction memory comprising second instruction stream instructions associated with said digital algorithm, said second instruction stream instructions each comprising configuration data for said logic computation unit, said circuit causing said second instruction stream memory to provide a corresponding second instruction stream instruction to said logic computation unit during each of said execution clock cycles.

18. An integrated circuit in accordance with claim 17, wherein:
each said second instruction stream instructions comprises output selection bits to select locations in said state memory to store said logic computation unit outputs.

19. An integrated circuit in accordance with claim 17, wherein:
each said second instruction stream instruction comprises input selection bits to select locations in said state memory to store said logic computation unit inputs.

20. An integrated circuit in accordance with claim 17, wherein:
each said second instruction stream instruction comprises a corresponding said instruction pointer.

21. An integrated circuit in accordance with claim 17, wherein:
said instruction stream memory and said second instruction stream memory are both only programmable during manufacture of said integrated circuit.

22. An integrated circuit in accordance with claim 17, wherein:
said instruction stream memory and said second instruction stream memory are both programmable subsequent to manufacture of said integrated circuit.

23. An integrated circuit in accordance with claim 14, wherein:
said logic computation unit comprises a plurality of input source selects each corresponding to one of said execution units, each said input source selects being programmably controllable by said at least one instruction to determine inputs to its corresponding one execution unit.

24. A method for providing an integrated circuit for computing one or more digital algorithms, comprising:
generating an instruction stream for a digital algorithm to be compiled into logic gates;
providing a first memory on said integrated circuit;
mapping said instruction stream into said first memory;
providing a second memory on said integrated circuit;
storing configuration data in conjunction with said digital algorithm in said second memory;
providing a third memory on said integrated circuit to selectively provide data inputs and to receive and store data outputs;
providing a logic computation unit on said integrated circuit, said logic computation unit comprising a programmable array of a plurality of execution units, each of said execution units being programmable to provide Boolean functionalities as determined by said instruction stream, each of said units being programmably interconnected with others of said execution units in accordance with said configuration data and each of said execution units programmably operating on said data inputs from said third memory to provide said data outputs for storage in said third memory;
providing execution clock cycles;
providing input data to said logic computation unit from said third memory during each of said execution clock cycles;
providing said instruction stream to said logic computation unit from said first memory during each of said execution clock cycles;
providing said configuration data to said logic computation unit from said second memory during each of said execution clock cycles; and
storing output data from said logic computation unit in said third memory during each of said execution cycles.

25. A method for providing an integrated circuit in accordance with claim 24, comprising:
providing said execution clock cycle to said first, second and third memories; and
selecting said execution clock cycles such that the time to compute said digital algorithm in a predetermined time.

26. A method for providing an integrated circuit in accordance with claim 24, comprising:
utilizing predetermined ones of said output data as said input data.

27. A method for providing an integrated circuit in accordance with claim 26, wherein:

predetermined ones of said output data output are intermediate Boolean states in the computation of said digital algorithm.

28. A method for providing an integrated circuit in accordance with claim 24, comprising:

providing for each of said execution units a Boolean execution element and an input source select element;

programming each said Boolean execution element in response to said instruction stream to provide a Boolean function;

programming each said input source select in response to said instruction stream to, determine inputs to its corresponding execution element.

29. A method for providing an integrated circuit in accordance with claim 24, comprising:

providing on said integrated circuit a programmable interconnect unit; and programming said interconnect unit to interconnect selectable ones of said plurality execution units.

30. A method for providing an integrated circuit in accordance with claim 24, comprising:

programming said integrated circuit as part of a manufacturing process by performing mapping said instruction stream into said first memory and storing said configuration data in said second memory as part of said manufacturing process.

31. A method for providing an integrated circuit in accordance with claim 24, comprising:

programming said integrated circuit as subsequent to manufacturing of said integrated circuit by performing mapping said instruction stream into said first memory and storing said configuration data in said second memory subsequent to said manufacturing process.

* * * * *